United States Patent
McLachlan et al.

(10) Patent No.: US 11,050,419 B2
(45) Date of Patent: Jun. 29, 2021

(54) HIGH-VOLTAGE UNITY-GAIN BUFFER

(71) Applicant: Analog Devices International Unlimited Company, Limerick (IE)

(72) Inventors: Roderick McLachlan, Edinburgh (GB); Fergus Downey, Raheen (IE)

(73) Assignee: Analog Devices International Unlimited Company, Limerick (IE)

( * ) Notice: Subject to any disclaimer, the term of this patent is extended or adjusted under 35 U.S.C. 154(b) by 428 days.

(21) Appl. No.: 15/388,726

(22) Filed: Dec. 22, 2016

(65) Prior Publication Data

US 2018/0183436 A1 Jun. 28, 2018

(51) Int. Cl.
*H03B 1/00* (2006.01)
*H03K 3/00* (2006.01)
*H03K 17/687* (2006.01)
*H03F 3/45* (2006.01)
*H03F 3/50* (2006.01)

(52) U.S. Cl.
CPC ..... *H03K 17/6872* (2013.01); *H03F 3/45475* (2013.01); *H03F 3/505* (2013.01); *H03F 2203/5018* (2013.01)

(58) Field of Classification Search
CPC ............. H03K 17/687; H03K 17/6871; H03K 17/6872
USPC .................................................. 327/108–112
See application file for complete search history.

(56) References Cited

U.S. PATENT DOCUMENTS

| 4,945,265 A * | 7/1990 | Estrada | H03K 3/2885 326/126 |
| 7,889,477 B2 * | 2/2011 | Neubarth | H02M 3/3384 361/212 |
| 2002/0093366 A1 * | 7/2002 | Fotouhi | H03K 19/00315 327/108 |
| 2013/0082604 A1 * | 4/2013 | Williams | H05B 33/0827 315/130 |
| 2013/0099681 A1 * | 4/2013 | Williams | H05B 33/083 315/185 R |
| 2014/0139267 A1 * | 5/2014 | Wang | H03F 3/45183 327/108 |
| 2015/0097541 A1 * | 4/2015 | Banag | G05F 1/46 323/281 |

OTHER PUBLICATIONS

King, Grayson, "Bootstrapping your op amp yields wide voltage swings", EDN Network, [Online]. Retrieved from the Internet: <URL: http://www.edn.com/design/analog/4361336/Bootstrapping-your-op-amp-yieids-wide-voltage-swings, (May 13, 1999), 2 pgs.

* cited by examiner

*Primary Examiner* — Diana J. Cheng
(74) *Attorney, Agent, or Firm* — Schwegman Lundberg & Woessner, P.A.

(57) ABSTRACT

Described are various techniques that can minimize the use of high-voltage devices in a unity-gain buffer that can be used in a high voltage application, while providing a circuit that generates an output that is an accurately buffered version of the input.

34 Claims, 9 Drawing Sheets

HIGH-VOLTAGE UNITY-GAIN BUFFER

FIELD OF THE DISCLOSURE

The present disclosure relates to the field of electronic buffer circuits and more particularly to unity gain buffer circuits.

BACKGROUND

Unity-gain buffers have a voltage gain of approximately one and thus provide essentially no amplification (or attenuation) of an input signal. In other words, the output is basically a buffered version of the input. Unity-gain buffers can have high input impedance and low output impedance and are widely used when it is undesirable to load a circuit, for example.

Unity-gain buffers can be used in high voltage applications. For example, a unity gain buffer can be coupled to one or more high voltage supplies, e.g., greater than 15 volts (V). To couple to the high voltage supplies, a unity-gain buffer circuit can use high voltage devices.

SUMMARY OF THE DISCLOSURE

This disclosure describes techniques that can minimize the use of high-voltage devices in a unity-gain buffer that can be used in a high voltage application, while providing a circuit that generates an output that is an accurately buffered version of the input.

In some aspects, this disclosure is directed to a circuit for use with high voltage supply nodes, wherein voltages of the high voltage supply nodes are large enough to exceed a voltage capability of a low voltage transistor structure in the circuit but not large enough to exceed a voltage capability of a high voltage transistor structure in the circuit, and voltages of low voltage supply nodes are low enough to accommodate a voltage capability of a low voltage transistor structure in the circuit. The circuit comprises a buffer circuit for providing substantially unity gain to an input signal applied thereto, the buffer including a current source with high-voltage capability configured to couple to a first high voltage supply node; a current sink with high-voltage capability configured to couple to a second high voltage supply node; a low voltage circuit coupled to low voltage supply nodes between the current source and the current sink. The low voltage circuit includes a differential stage having a first input and a second input, the first input configured to receive the input signal and the second input configured to receive a representation of an output of the buffer circuit. The buffer includes an output transistor circuit connected in a follower configuration and coupled to the output of the differential stage, the output transistor circuit configured to provide the output voltage of the buffer circuit.

In some aspects, this disclosure is directed to a buffer circuit for providing substantially unity gain to an input signal applied thereto and for use with high voltage supply nodes, wherein voltages of the high voltage supply nodes are large enough to exceed a voltage capability of a low voltage transistor structure in the circuit but not large enough to exceed a voltage capability of a high voltage transistor structure in the circuit, and voltages of low voltage supply nodes are low enough to accommodate a voltage capability of a low voltage transistor structure in the circuit. The buffer circuit comprises a current source with high-voltage capability configured to couple to a first high voltage supply node; a current sink with high-voltage capability configured to couple to a second high voltage supply node; a low voltage circuit coupled to low voltage supply nodes between the current source and the current sink. The low voltage circuit includes a differential stage having a first input and a second input, the first input configured to receive the input signal and the second input configured to receive a representation of an output of the buffer circuit. The buffer circuit includes an output transistor circuit connected in a follower configuration and coupled to the output of the differential stage, the output transistor circuit configured to provide the output voltage of the buffer circuit.

In some aspects, this disclosure is directed to a method for providing substantially unity gain to an input signal applied thereto and for use with high voltage supply nodes, wherein voltages of the high voltage supply nodes are large enough to exceed a voltage capability of a low voltage transistor structure in the circuit but not large enough to exceed a voltage capability of a high voltage transistor structure in the circuit, and voltages of low voltage supply nodes are low enough to accommodate a voltage capability of a low voltage transistor structure in a circuit. The method comprises coupling a current source with high-voltage capability to a first high voltage supply node; coupling a current sink with high-voltage capability to a second high voltage supply node; coupling a low voltage circuit to low voltage supply nodes between the current source and the current sink, the low voltage circuit including a differential stage having a first input and a second input; receiving the input signal using the first input and receiving a representation of an output of the buffer circuit using the second input; coupling an output transistor circuit connected in a follower configuration to the output of the differential stage; and providing, using the output transistor circuit, the output voltage of the buffer circuit.

This overview is intended to provide an overview of subject matter of the present patent application. It is not intended to provide an exclusive or exhaustive explanation of the invention. The detailed description is included to provide further information about the present patent application.

Figure 1:
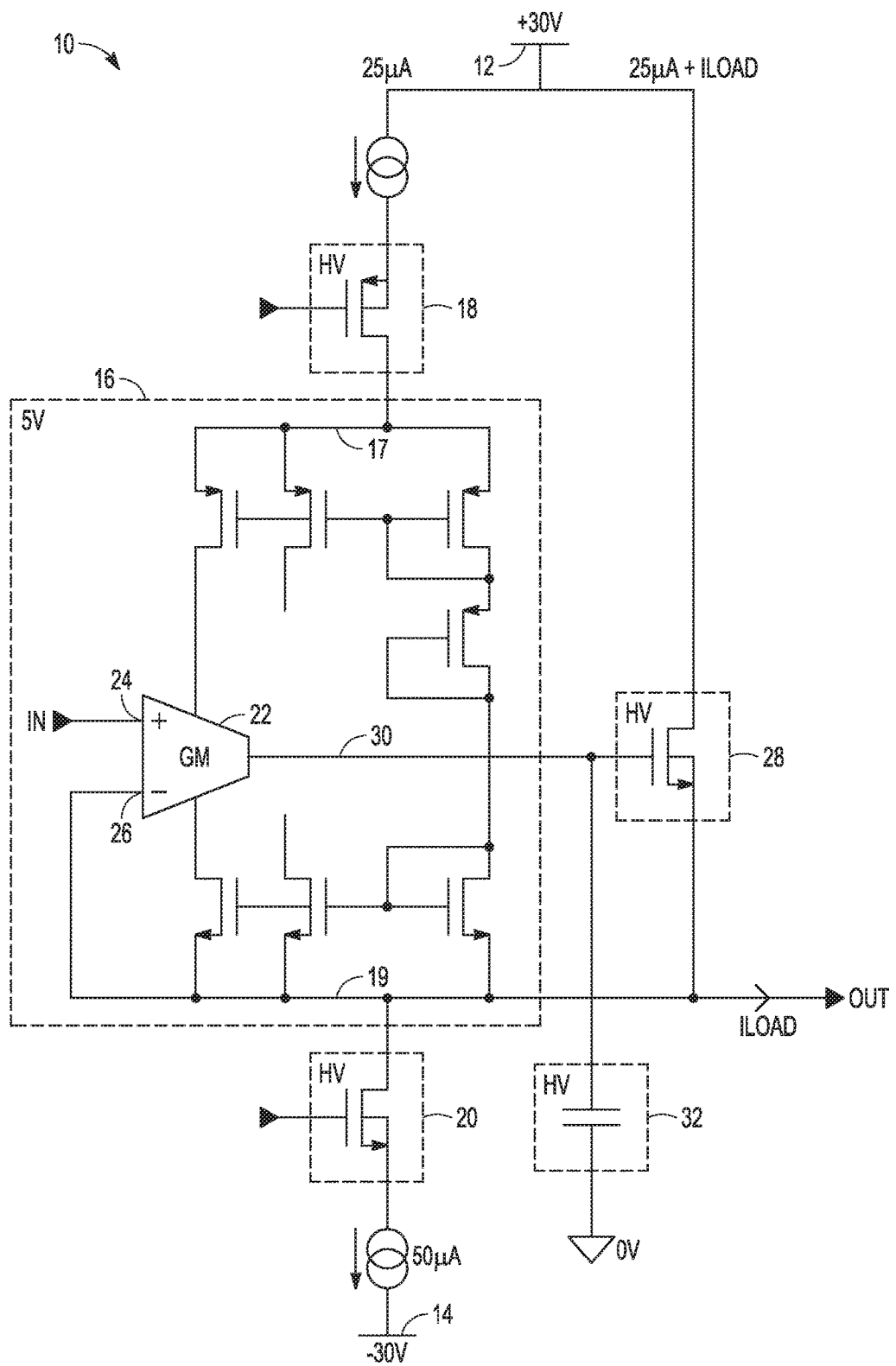
FIG. 1 is an example of a unity-gain buffer circuit that can implement various techniques of this disclosure.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Modern integrated circuit fabrication processes, e.g., CMOS processes, often include both low-voltage, e.g., 5V or less, and high-voltage devices. Low-voltage devices can be small and many of them can be efficiently placed adjacent to each other when they are at a common potential. High-voltage devices can be large and often need to be separated from other devices by a larger distance than low-voltage devices. To fabricate a unity-gain buffer that can be used in a high voltage application, both low voltage and high voltage devices may be needed. This disclosure describes techniques that can minimize the use of high-voltage devices in a unity-gain buffer that can be used in a high voltage application, while providing a circuit that generates an output that is an accurately buffered version of the input.

FIG. 1 is an example of a unity-gain buffer circuit that can implement various techniques of this disclosure. FIG. 1 depicts a buffer circuit 10 for providing substantially unity gain to an input signal (IN) applied thereto. The buffer circuit 10 can be used with high voltage supply nodes, where voltages of the high voltage supply nodes are large enough to exceed a voltage capability of a low voltage transistor structure in the circuit but not large enough to exceed a voltage capability of a high voltage transistor structure in the circuit, and voltages of low voltage supply nodes are low enough to accommodate a voltage capability of a low voltage transistor structure in the circuit.

As seen in the non-limiting example of FIG. 1, the first and second power supply nodes 12, 14 coupled to the buffer 10 can be high voltage, e.g., +30V and −30V, relative to a low voltage circuit 16, e.g., a 5V circuit. The buffer 10 can include a current source 18 with high-voltage capability configured to couple to a first high voltage supply node, e.g., +30V in FIG. 1, and a current sink 20 with high-voltage capability configured to couple to a second high voltage supply node, e.g., −30V in FIG. 1.

The low voltage circuit 16 can be coupled to low voltage supply nodes 17, 19 between the current source 18 and the current sink 20 and, as such, the low voltage circuit 16 can float. The current source 18 can supply the positive supply to the low voltage circuit 16. Generally, the floating low voltage circuit 16 is biased with respect to the same voltage level as the input signal IN, which can result in excellent power supply rejection and common-mode rejection.

The low voltage circuit can include a differential stage 22 having a first input 24, e.g., non-inverting input, and a second input 26, e.g., inverting input. The first input 24 can be configured to receive the input signal (IN) and the second input 26 can be configured to receive a representation of an output (OUT) of the buffer 10. Where the highest accuracy is sought, the input 26 can be wired to receive a representation of an output OUT at the physical location in the circuit where a high accuracy of the output OUT is desirable. In the example configuration shown in FIG. 1, the differential stage 22 of the low voltage circuit 16 can include a transconductance amplifier (Gm) having a differential input.

The buffer can further include an output transistor circuit 28 connected in a follower configuration and coupled to the output 30 of the differential stage 22. The output 30 of the differential stage 22 can drive, either directly or indirectly, the output transistor circuit 28. The output transistor circuit 28 can be configured to provide the output voltage OUT of the buffer circuit 10.

The current sink 20 can provide a bias to the output transistor circuit 28. In the specific non-limiting example shown in FIG. 1, the current sink 20 can provide more current than the current source 18, e.g., sink 50 microamps as compared to source 25 microamps. The difference in current between the current sink 20 and the current source 18 is the bias current in the output transistor circuit 28.

In example configurations that include a transconductance amplifier (Gm), such as shown in FIG. 1, the transconductance amplifier 22 can act to adjust the drive voltage to the output transistor circuit 28 until the differential input of the transconductance amplifier 22 is about zero, thus the output voltage OUT is a buffered copy of the input voltage IN. If the output is loaded by a load that draws current, this additional current ILOAD can flow through the output transistor circuit 28.

In some example implementations, the buffer 10 can include a capacitor 32 placed on the output of the transconductance stage 22 to provide circuit stability. It can be desirable that the capacitor 32 be capable of withstanding high voltage.

It should be noted that although the circuit of FIG. 1 depicts field-effect transistors, bipolar-junction transistors can replace the field-effect transistors or, in some examples, can be used in conjunction with the field-effect transistors, e.g., BiCMOS, to implement various techniques of this disclosure.

In addition, it should be noted that the n-type and p-type transistors shown in FIG. 1 can be swapped. That is, the NFETs can be replaced by PFETs and the PFETs can be replaced by NFETs.

Figure 2:
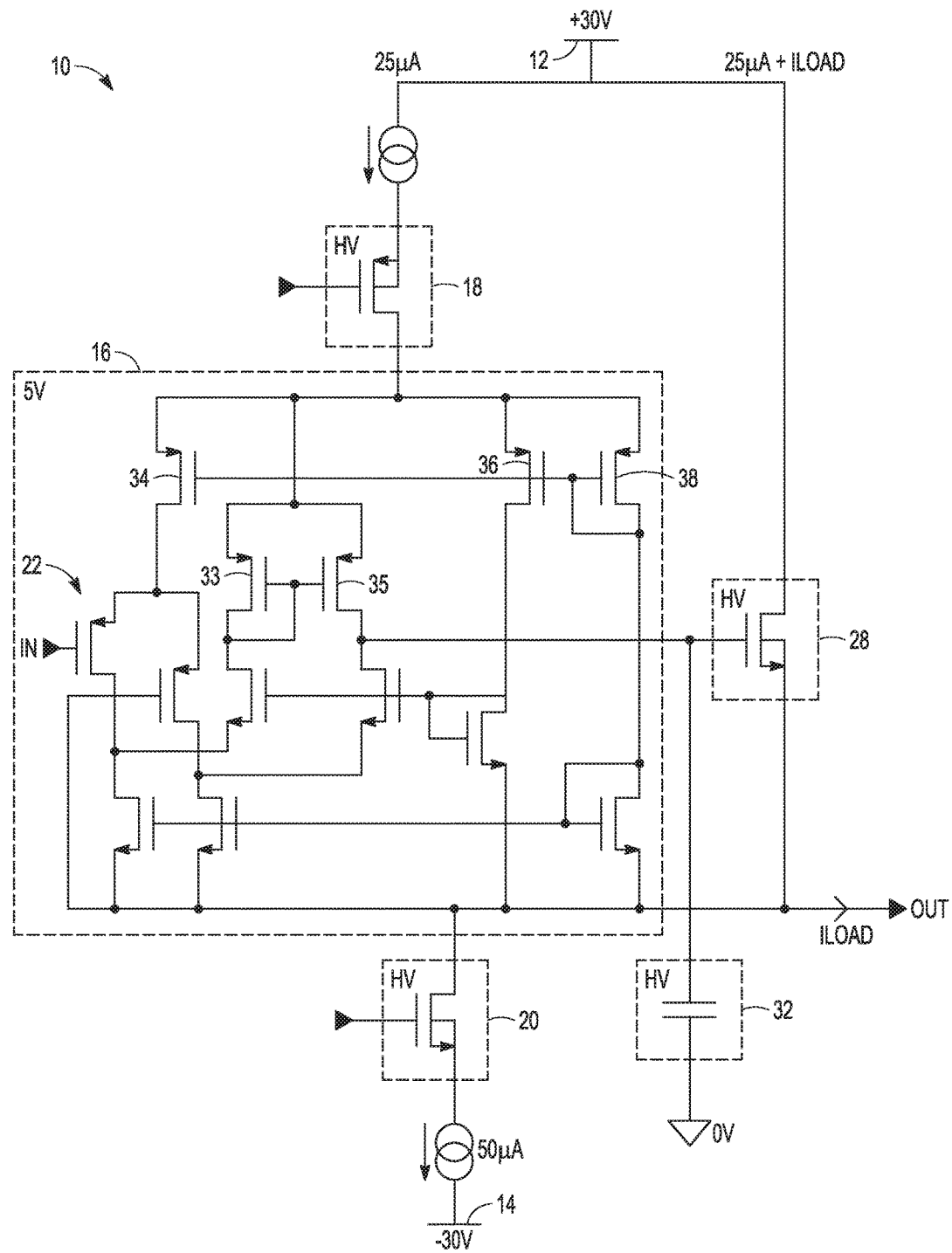
FIG. 2 is another example of a unity-gain buffer circuit that can implement various techniques of this disclosure.

FIG. 2 is another example of a unity-gain buffer circuit that can implement various techniques of this disclosure. More particularly, FIG. 2 depicts an example configuration of the low voltage circuit 16 of FIG. 1. In FIG. 2, the current from the current source 18, e.g., 25 microamps, can split among the transistors 33, 34, 35, 36, and 38, e.g., p-type field effect transistors. The relative sizes of the transistors 34, 36, and 38 can determine the proportion of the current. This subdivided current, e.g., 25 microamps, can be used to bias the floating low voltage circuit 16, e.g., 5V circuit, and create a transconductance stage to implement the transconductance amplifier 22.

In some example configurations, the transconductance amplifier 22 can include a plurality of transistors connected in a cascode configuration. In the example configuration shown in FIG. 2, the transconductance amplifier 22 can include a plurality of transistors connected in a folded cascode configuration. Although FIG. 2 depicts a PMOS-input folded cascode, an NMOS-input can be used as well as other transconductance configurations.

In some implementations, it can be desirable for the unity-gain buffer 10 to be able to sink load current as well as source load current. An example unity-gain buffer circuit that can sink load current is shown in FIG. 3.

Figure 3:
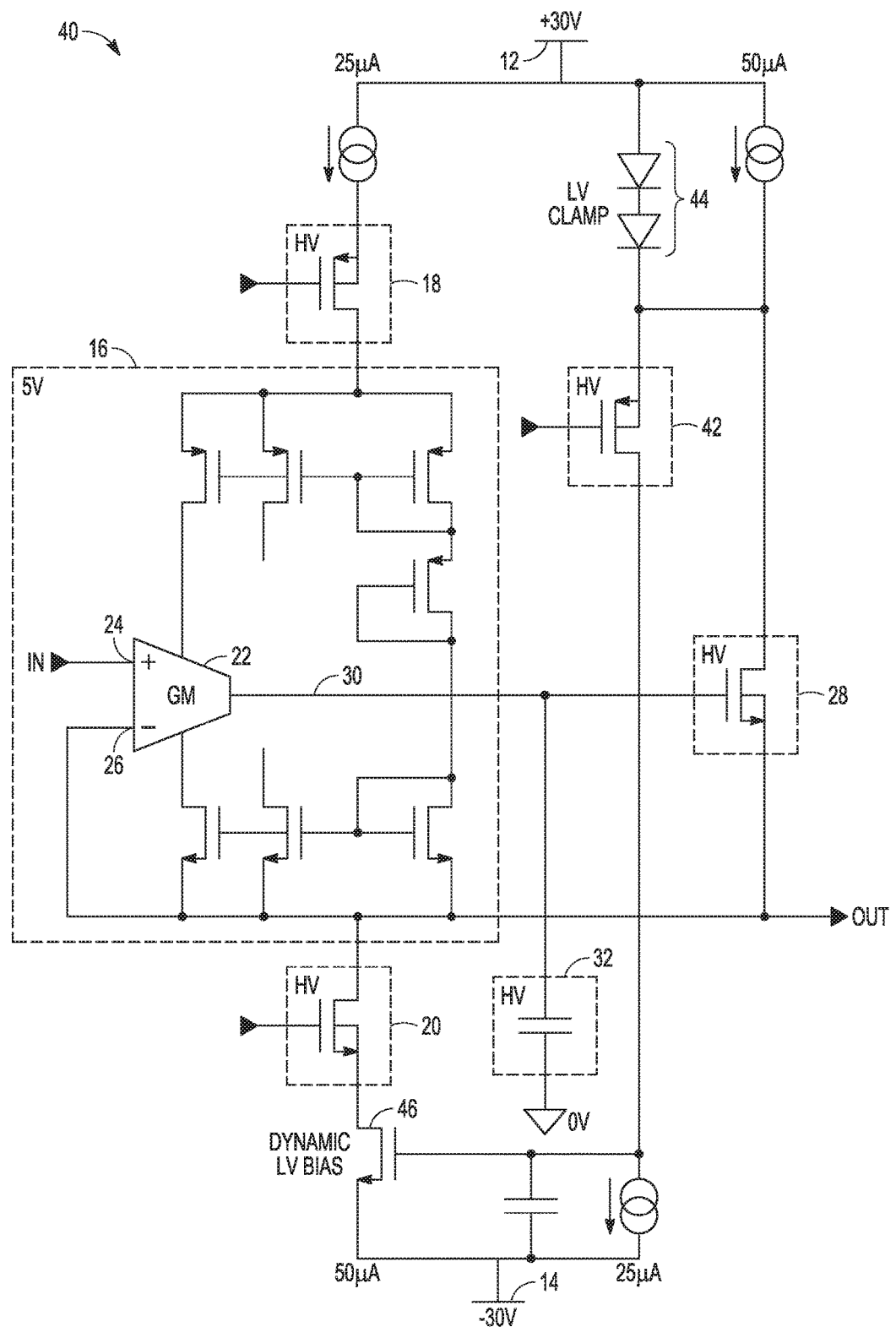
FIG. 3 is another example of a unity-gain buffer circuit that can implement various techniques of this disclosure.

FIG. 3 is another example of a unity-gain buffer circuit that can implement various techniques of this disclosure. The buffer circuit 40 of FIG. 3 can include an additional high voltage device, shown as transistor 42. In the specific non-limiting implementation shown, the transistor 42 can be coupled to the high voltage supply node, e.g., +30V, by a low voltage clamp 44.

In addition, the circuit 40 can include a dynamic low voltage bias transistor 46 coupled to the current sink 20 and configured to dynamically bias the current sink 20. In particular, if the current in the output transistor circuit 28 drops too low, the transistor 42 can conduct more current, thereby increasing the bias on the dynamic low voltage bias transistor 46. Increasing the bias on the dynamic low voltage bias transistor 46 can increase the current through the current sink 20 to the output transistor circuit 28.

Figure 4A:
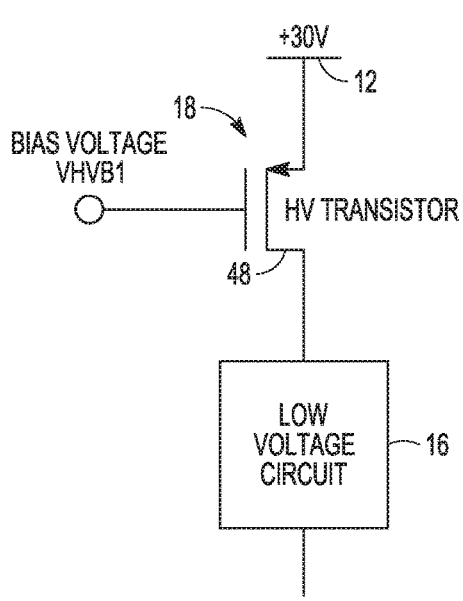
FIGS. 4A and 4B depict example configurations of a current source with high-voltage capability that can be used to implement various techniques of this disclosure.
Figure 4B:
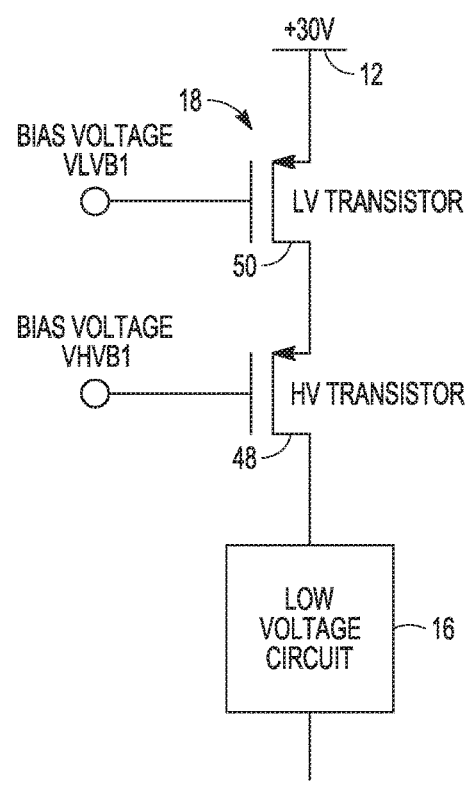

FIGS. 4A and 4B depict example configurations of a current source with high-voltage capability that can be used to implement various techniques of this disclosure. In some example implementations and as shown in FIG. 4A, the current source 18, e.g., of FIG. 1, can include a high-voltage transistor 48 coupled between the low voltage circuit 16 and coupled to the high-voltage supply 12, e.g., +30V, and configured to receive a bias voltage (VHVB1).

Low voltage transistors, however, can be more accurate than high voltage transistors. Therefore, in some example implementations of a current source 18 with high-voltage capability, it can be desirable to utilize a low voltage transistor 50 in combination with a high-voltage transistor 48. The low voltage transistor 50 can function as the current source 18, e.g., of FIG. 1, and the high voltage transistor 48 can protect the low-voltage transistor 50, as shown in FIG. 4B. The high-voltage transistor 48 can be coupled to the low voltage circuit 16 and be configured to receive a first bias voltage (VHVB1), and the low-voltage circuit can be coupled to the high-voltage supply, e.g., +30V, and configured to receive a second bias voltage (VLVB1).

As described above with respect to FIGS. 1-3, the buffer circuit can include an output transistor circuit 28 connected in a follower configuration and coupled to the output 30 of the differential stage 22, where the output transistor circuit 28 can be configured to provide the output voltage OUT of the buffer circuit. The output transistor circuit 28 can be implemented using various configurations including the non-limiting configurations shown in FIGS. 5A-5D.

Figure 5A:
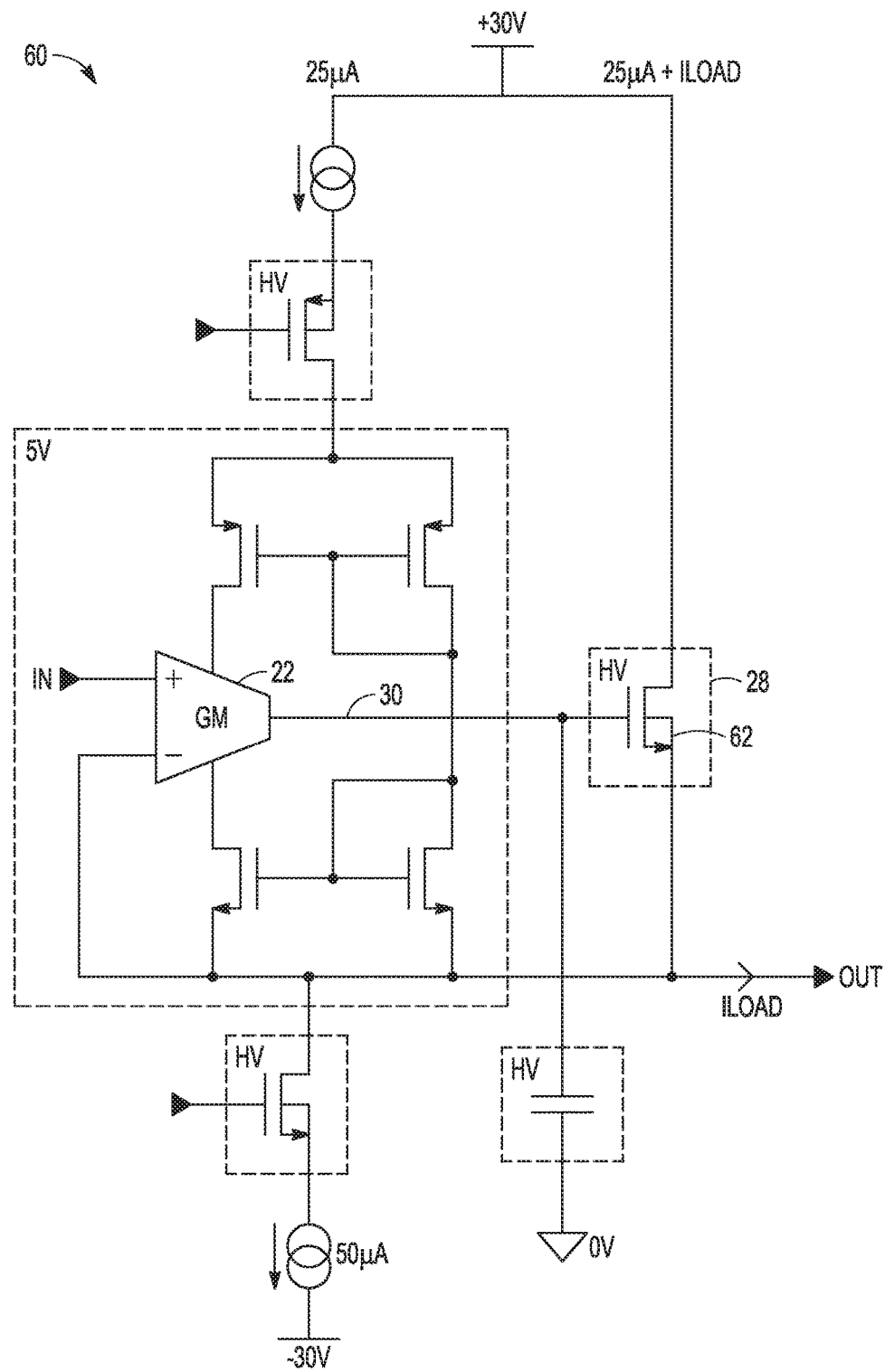
FIGS. 5A-5D depict example configurations of an output transistor circuit connected in a follower configuration that can be used to implement various techniques of this disclosure.

FIGS. 5A-5D depict example configurations of an output transistor circuit connected in a follower configuration that can be used to implement various techniques of this disclosure. In FIG. 5A, the output transistor circuit 28 of the buffer circuit 60 can include a single high voltage transistor 62, e.g., field effect transistor, connected in a follower configuration and coupled to the output 30 of the differential stage 22, e.g., transconductance amplifier. The single high voltage transistor 62 can be configured to provide the output voltage OUT of the buffer circuit 60.

Figure 5B:
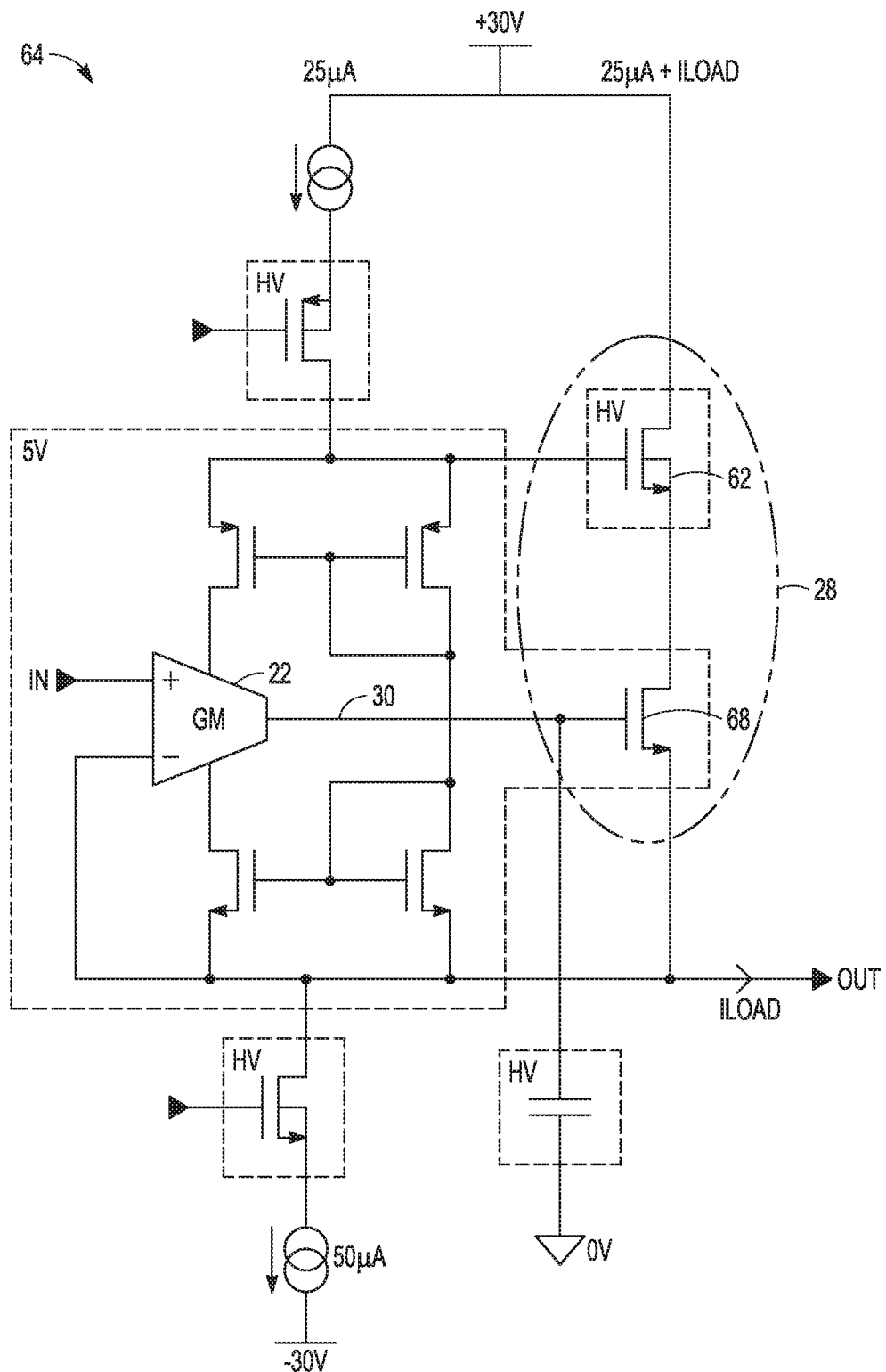
Figure 5C:
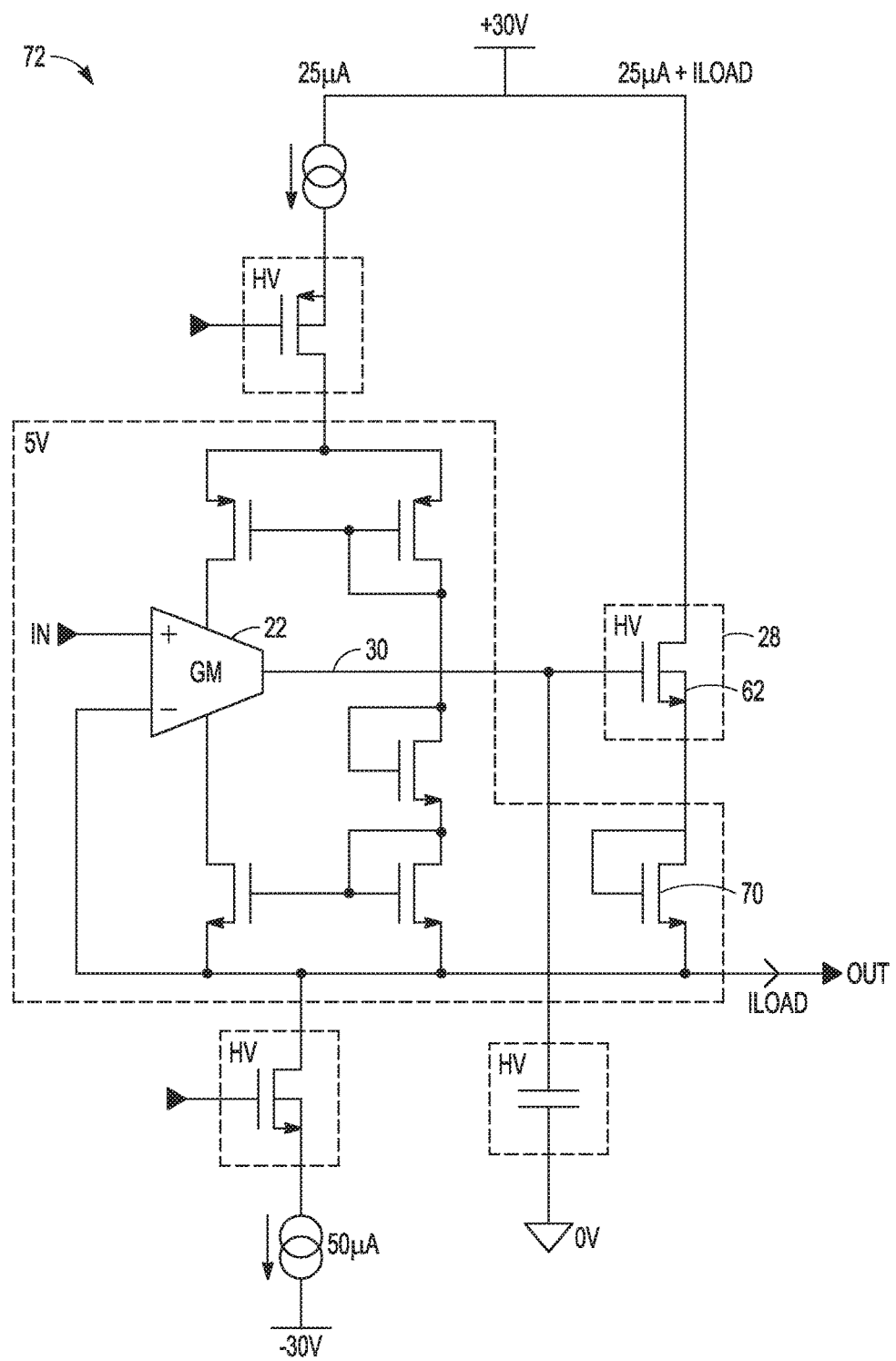
Figure 5D:
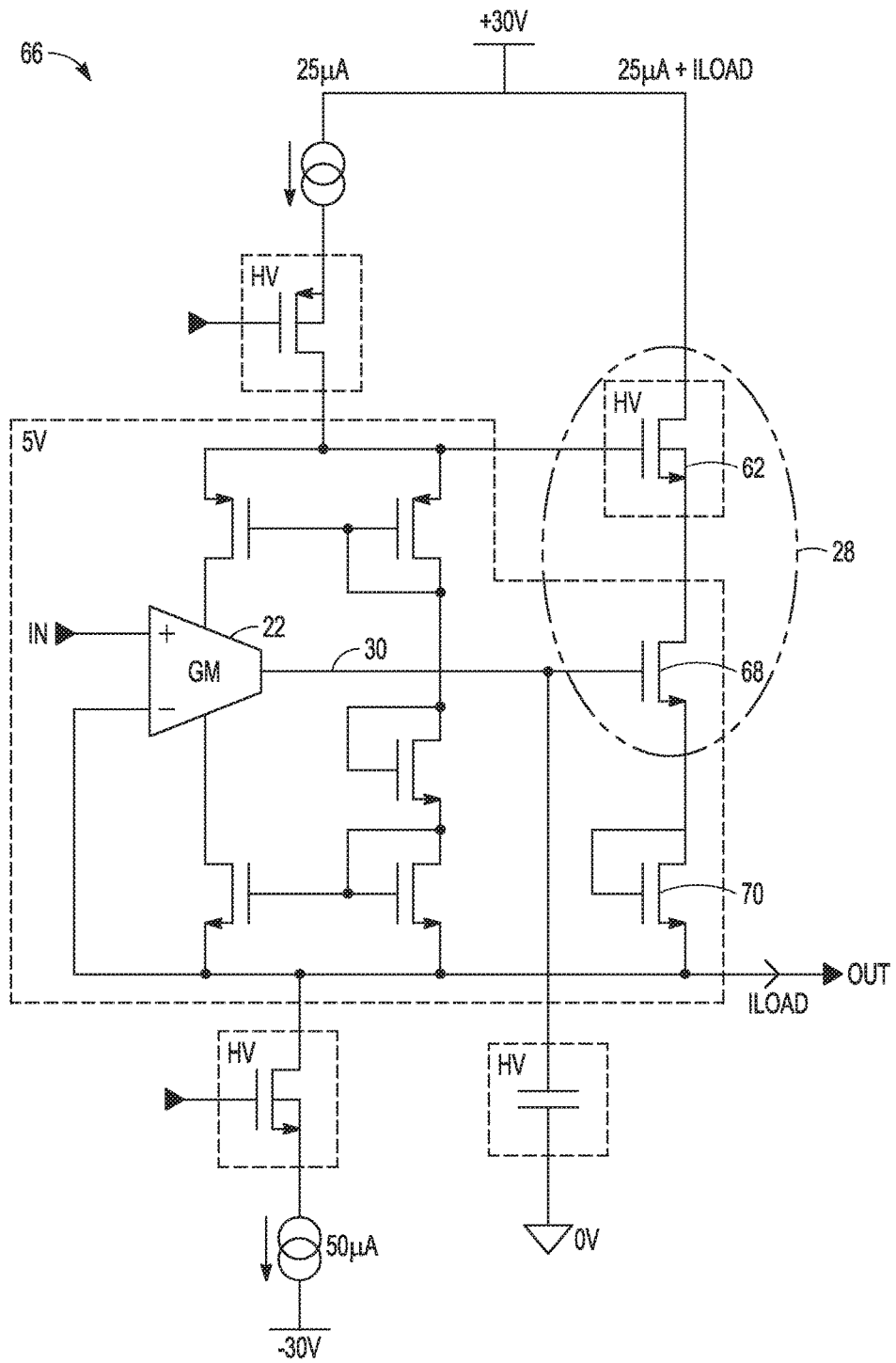

In some example buffer circuit configurations 64, 66, such as shown in FIGS. 5B and 5D, respectively, the output transistor circuit 28 of the buffer can include a low voltage transistor 68, e.g., field effect transistor, connected in a follower configuration and coupled in series to a high voltage transistor 62, where the low voltage transistor 68 can be coupled to the output 30 of the differential stage 22, e.g., transconductance amplifier. The low voltage transistor 68 can be coupled in series to a high voltage transistor 62 to protect the low voltage transistor. The low voltage transistor 68 can be configured to provide the output voltage OUT of the buffer circuit.

In some implementations, it can be desirable to add a voltage level shifting device to increase the headroom of the differential stage 22, e.g., transconductance amplifier. For example, the output transistor circuit 28 can include a voltage level shifting device 70, such as shown in the example buffer circuit configurations 72 and 66 of FIGS. 5C and 5D, respectively. In some non-limiting examples, the voltage level shifting device 70 can include a diode-connected transistor.

Figure 6:
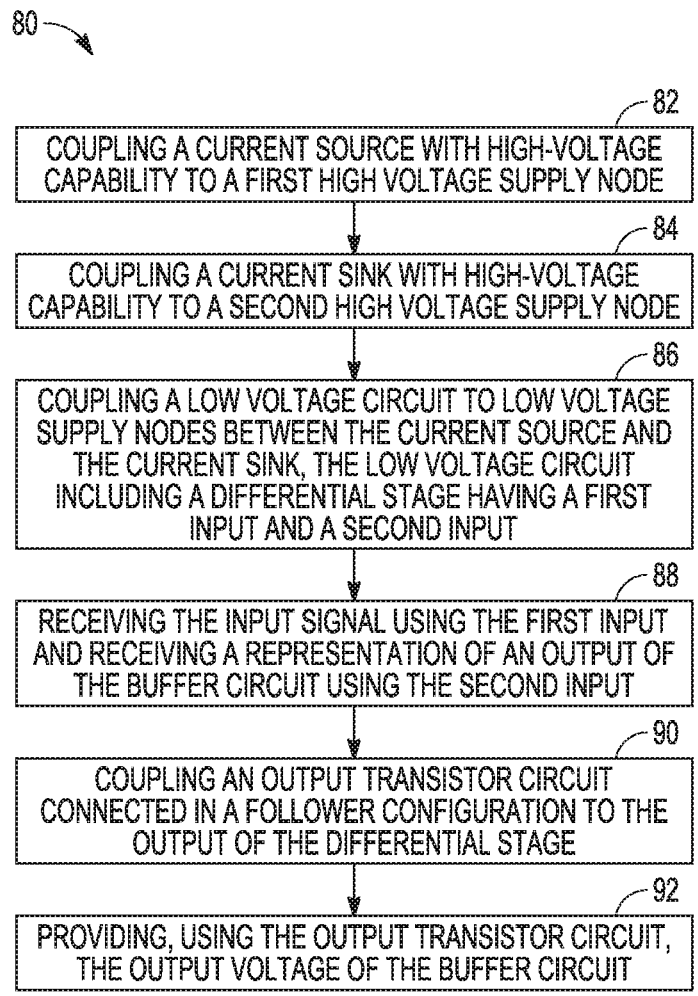
FIG. 6 is a flow diagram depicting an example method for providing substantially unity gain to an input signal applied thereto and for use with high voltage supply nodes.

FIG. 6 is a flow diagram depicting an example method for providing substantially unity gain to an input signal applied thereto and for use with high voltage supply nodes. As mentioned above, voltages of the high voltage supply nodes are large enough to exceed a voltage capability of a low voltage transistor structure in the circuit but not large enough to exceed a voltage capability of a high voltage transistor structure in the circuit, and voltages of low voltage supply nodes are low enough to accommodate a voltage capability of a low voltage transistor structure in a circuit.

As seen in FIG. 6, at block 82, the method 80 can include coupling a current source, e.g., current source 18 of FIG. 1, with high-voltage capability to a first high voltage supply node, e.g., supply node 12 of FIG. 1. At block 84, the method can include coupling a current sink, e.g., current sink 20 of FIG. 1, with high-voltage capability to a second high voltage supply node, e.g., supply node 14 of FIG. 1. At block 86, the method can include coupling a low voltage circuit, e.g., circuit 16 of FIG. 1, to low voltage supply nodes between the current source and the current sink, the low voltage circuit including a differential stage having a first input and a second input, e.g., the differential stage 22 of FIG. 1.

At block 88, the method can include receiving the input signal using the first input and receiving a representation of an output of the buffer circuit using the second input. For example, the differential stage 22 of FIG. 1 can receive input signal IN using the first input 24, and can receive a representation of the output OUT of the buffer circuit using the second input 26.

At block 90, the method can include coupling an output transistor circuit, e.g., circuit 28 of FIG. 1, connected in a follower configuration to the output of the differential stage, e.g., the differential stage 22 of FIG. 1. At block 92, the method can include providing, using the output transistor circuit, the output voltage of the buffer circuit. For example, the output voltage OUT can be provide using the output transistor circuit 28 of FIG. 1.

Various Notes

Aspect 1 includes subject matter (such as a device, system, circuit, apparatus, or machine) for use with high voltage supply nodes, wherein voltages of the high voltage supply nodes are large enough to exceed a voltage capability of a low voltage transistor structure in the circuit but not large enough to exceed a voltage capability of a high voltage transistor structure in the circuit, and voltages of low voltage supply nodes are low enough to accommodate a voltage capability of a low voltage transistor structure in the circuit, the circuit comprising: a buffer circuit for providing substantially unity gain to an input signal applied thereto, the buffer including: a current source with high-voltage capability configured to couple to a first high voltage supply node; a current sink with high-voltage capability configured to couple to a second high voltage supply node; a low voltage circuit coupled to low voltage supply nodes between the current source and the current sink, the low voltage circuit including: a differential stage having a first input and a second input, the first input configured to receive the input signal and the second input configured to receive a representation of an output of the buffer circuit; and the buffer circuit including an output transistor circuit connected in a follower configuration and coupled to the output of the differential stage, the output transistor circuit configured to provide the output voltage of the buffer circuit.

In Aspect 2, the subject matter of Aspect 1 can optionally include, wherein the differential stage includes a transconductance amplifier.

In Aspect 3, the subject matter of Aspect 2 can optionally include, wherein the transconductance amplifier includes a plurality of transistors connected in a cascode configuration.

In Aspect 4, the subject matter of one or more of Aspects 1-3 can optionally include, wherein the output transistor circuit includes a field effect transistor.

In Aspect 5, the subject matter of Aspect 4 can optionally include, wherein the field effect transistor is a low-voltage field effect transistor, and wherein the output transistor circuit further comprises: a high-voltage field effect transistor coupled in series with the low-voltage field effect transistor to protect the low-voltage field effect transistor.

In Aspect 6, the subject matter of Aspect 4 can optionally include, wherein the output transistor circuit further comprises: a voltage level shifting device coupled to a source terminal of the field effect transistor.

In Aspect 7, the subject matter of Aspect 6 can optionally include, wherein the voltage level shifting device includes a diode-connected transistor.

In Aspect 8, the subject matter of one or more of Aspects 1-7 can optionally include, wherein the output transistor circuit includes a single high-voltage field effect transistor.

In Aspect 9, the subject matter of one or more of Aspects 1-7 can optionally include, the output transistor circuit includes a high voltage transistor.

In Aspect 10, the subject matter of one or more of Aspects 1-3, 7, and 9 can optionally include, wherein the output transistor circuit includes a bipolar-junction transistor.

In Aspect 11, the subject matter of one or more of Aspects 1-10 can optionally include, wherein the buffer circuit is configured to dynamically bias the current sink at a higher current if a current of the output transistor circuit begins to decrease.

In Aspect 12, the subject matter of one or more of Aspects 1-11 can optionally include, a dynamic low voltage bias transistor coupled to the current sink and configured to dynamically bias the current sink.

In Aspect 13, the subject matter of one or more of Aspects 1-12 can optionally include, wherein the buffer circuit is configured to dynamically bias the current source at a higher current if a current of the output transistor circuit begins to decrease.

In Aspect 14, the subject matter of one or more of Aspects 1-13 can optionally include, a dynamic low voltage bias transistor coupled to the current source and configured to dynamically bias the current sink.

In Aspect 15, the subject matter of one or more of Aspects 1-14 can optionally include, wherein the current source includes a low voltage transistor and a high voltage transistor.

Aspect 16 includes subject matter (such as a method, means for performing acts, machine readable medium including instructions that when performed by a machine cause the machine to performs acts, or an apparatus configured to perform) for providing substantially unity gain to an input signal applied thereto and for use with high voltage supply nodes, wherein voltages of the high voltage supply nodes are large enough to exceed a voltage capability of a low voltage transistor structure in the circuit but not large enough to exceed a voltage capability of a high voltage transistor structure in the circuit, and voltages of low voltage supply nodes are low enough to accommodate a voltage capability of a low voltage transistor structure in a circuit, the method comprising: coupling a current source with high-voltage capability to a first high voltage supply node; coupling a current sink with high-voltage capability to a second high voltage supply node; coupling a low voltage circuit to low voltage supply nodes between the current source and the current sink, the low voltage circuit including a differential stage having a first input and a second input; receiving the input signal using the first input and receiving a representation of an output of the buffer circuit using the second input; coupling an output transistor circuit connected in a follower configuration to the output of the differential stage; and providing, using the output transistor circuit, the output voltage of the buffer circuit.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

For example, while the impedance elements and the switches are shown in one order between the input terminals and the summing nodes in the drawings, this should not be construed as limiting, because in various embodiments, the impedance elements and the switches may be disposed in a different order while maintaining the same functional performance, according to the understanding of one of ordinary skill in the art in view of the teachings herein. In addition, a single impedance element in the drawings may be replaced by a plurality of different impedance elements while maintaining a same functional performance, and a single switch in the figures may be replaced by a plurality of different switches while maintaining a same functional performance, according to the understanding of one of ordinary skill in the art in view of the teachings herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A circuit for use with high voltage supply nodes, wherein voltages of the high voltage supply nodes are large enough to exceed a voltage capability of a low voltage transistor structure in the circuit but not large enough to exceed a high voltage capability of a high voltage transistor structure in the circuit, voltages of low voltage supply nodes are low enough to accommodate a voltage capability of a low voltage transistor structure in the circuit, the low voltage supply nodes derived from the high voltage supply nodes, the low voltage supply nodes including a low voltage upper rail and a low voltage lower rail, the high voltage supply nodes including a high voltage upper rail and a high voltage lower rail, the circuit comprising:
   a buffer circuit for providing a gain to an input signal applied thereto, the buffer circuit including:
      an output transistor circuit; and
      a low voltage circuit coupled between the high voltage supply nodes and to the low voltage upper and lower rails, wherein the low voltage upper and lower rails are biased with respect to a voltage level of the input signal, the low voltage circuit including:
         a differential stage configured to receive the input signal and a representation of an output of the buffer circuit,
         wherein the output transistor circuit is coupled to an output of the differential stage and configured to provide the output of the buffer circuit.

2. The circuit of claim 1, wherein the differential stage includes a transconductance amplifier.

3. The circuit of claim 2, wherein the transconductance amplifier includes a plurality of transistors connected in a cascode configuration.

4. The circuit of claim 1, wherein the output transistor circuit includes a field effect transistor.

5. The circuit of claim 4, wherein the field effect transistor is a low-voltage field effect transistor, and wherein the output transistor circuit further comprises:
   a high-voltage field effect transistor coupled in series with the low-voltage field effect transistor to protect the low-voltage field effect transistor.

6. The circuit of claim 4, wherein the output transistor circuit further comprises:
   a voltage level shifting device coupled to a source terminal of the field effect transistor.

7. The circuit of claim 6, wherein the voltage level shifting device includes a diode-connected transistor.

8. The circuit of claim 1, wherein the output transistor circuit includes a single high-voltage field effect transistor.

9. The circuit of claim 1, wherein the output transistor circuit includes a high voltage transistor.

10. The circuit of claim 1, wherein the output transistor circuit includes a bipolar-junction transistor.

11. The circuit of claim 1, further comprising:
    a current sink with high-voltage capability configured to couple to the high voltage lower rail,
    wherein the buffer circuit is configured to dynamically bias the current sink at a higher current if a current of the output transistor circuit begins to decrease.

12. The circuit of claim 11, further comprising:
    a dynamic low voltage bias transistor coupled to the current sink and configured to dynamically bias the current sink.

13. The buffer circuit of claim 11, wherein the gain is a unity gain.

14. The circuit of claim 1, further comprising:
    a current source with high-voltage capability configured to couple to the high voltage upper rail,
    wherein the buffer circuit is configured to dynamically bias the current source at a higher current if a current of the output transistor circuit begins to decrease.

15. The circuit of claim 14, further comprising:
    a dynamic low voltage bias transistor coupled to the current source and configured to dynamically bias the current sink.

16. The circuit of claim 1, further comprising:
    a current source with high-voltage capability configured to couple to the high voltage upper rail,
    wherein the current source includes a low voltage transistor and a high voltage transistor.

17. The circuit of claim 1, further comprising:
    a current source with high-voltage capability configured to couple to the high voltage upper rail; and
    a current sink with high-voltage capability configured to couple to the high voltage lower rail.

18. The circuit of claim 1, wherein the output transistor circuit is connected in a follower configuration.

19. The circuit of claim 1, wherein the output of the differential stage is connected to a control node of the output transistor circuit.

20. A buffer circuit for providing a gain to an input signal applied thereto and for use with high voltage supply nodes, wherein voltages of the high voltage supply nodes are large enough to exceed a voltage capability of a low voltage transistor structure in the circuit but not large enough to exceed a high voltage capability of a high voltage transistor structure in the circuit, voltages of low voltage supply nodes are low enough to accommodate a voltage capability of a low voltage transistor structure in the circuit, the low voltage supply nodes derived from the high voltage supply nodes, the low voltage supply nodes including a low voltage upper rail and a low voltage lower rail, the high supply voltage supply nodes including a high voltage upper rail and a high voltage lower rail, the buffer circuit comprising:
  an output transistor circuit; and
  a low voltage circuit coupled between the high voltage supply nodes and to the low voltage upper and lower rails, wherein the low voltage upper and lower rails are biased with respect to a voltage level of the input signal, the low voltage circuit including:
    a differential stage configured to receive the input signal and a representation of an output of the buffer circuit, wherein the output transistor circuit is coupled to an output of the differential stage and configured to provide the output of the buffer circuit.

21. The circuit of claim 20, wherein the differential stage includes a transconductance amplifier.

22. The circuit of claim 21, wherein the transconductance amplifier includes a plurality of transistors connected in a cascode configuration.

23. The circuit of claim 20, wherein the output transistor circuit includes a field effect transistor.

24. The circuit of claim 20, further comprising:
  a current source with high-voltage capability configured to couple to the high voltage upper rail; and
  a current sink with high-voltage capability configured to couple to the high voltage lower rail.

25. The circuit of claim 20, wherein the output transistor circuit is connected in a follower configuration.

26. The buffer circuit of claim 20, wherein the output of the differential stage is connected to a control node of the output transistor circuit.

27. The buffer circuit of claim 20, wherein the gain is a unity gain.

28. A method for operating a buffer circuit configured to provide a gain to an input signal applied thereto and for use with high voltage supply nodes, wherein voltages of the high voltage supply nodes are large enough to exceed a voltage capability of a low voltage transistor structure in the circuit but not large enough to exceed a high voltage capability of a high voltage transistor structure in the circuit, voltages of low voltage supply nodes are low enough to accommodate a voltage capability of a low voltage transistor structure in a circuit, the low voltage supply nodes derived from the high voltage supply nodes, the low voltage supply nodes including a low voltage upper rail and a low voltage lower rail, the high voltage supply nodes including a high voltage upper rail and a high voltage lower rail, the method comprising:
  coupling a low voltage circuit between the high voltage supply nodes and to the low voltage upper and lower rails, wherein the low voltage upper and lower rails are biased with respect to a voltage level as the input signal, the low voltage circuit including a differential stage having a first input and a second input;
  receiving the input signal using the first input and receiving a representation of an output of the buffer circuit using the second input;
  coupling an output transistor circuit to an output of the differential stage; and
  providing, using the output transistor circuit, the output of the buffer circuit.

29. The method of claim 28, further comprising:
  coupling a current source with high-voltage capability to the high voltage upper rail; and
  coupling a current sink with high-voltage capability to the high voltage lower rail.

30. A circuit for use with high voltage supply nodes, wherein voltages of the high voltage supply nodes are large enough to exceed a voltage capability of a low voltage transistor structure in the circuit but not large enough to exceed a voltage capability of a high voltage transistor structure in the circuit, and voltages of low voltage supply nodes are low enough to accommodate a voltage capability of a low voltage transistor structure in the circuit, the circuit comprising:
  a buffer circuit for providing substantially unity gain to an input signal applied thereto, the buffer including:
    a current source with high-voltage capability configured to couple to a first high voltage supply node;
    a current sink with high-voltage capability configured to couple to a second high voltage supply node;
    a low voltage circuit coupled to low voltage supply nodes between the current source and the current sink, the low voltage circuit including:
      a differential stage having a first input and a second input, the first input configured to receive the input signal and the second input configured to receive a representation of an output of the buffer circuit; and
      an output transistor circuit connected in a follower configuration and coupled to the output of the differential stage, the output transistor circuit configured to provide the output voltage of the buffer circuit.

31. The circuit of claim 30, wherein the differential stage includes a transconductance amplifier.

32. The circuit of claim 31, wherein the transconductance amplifier includes a plurality of transistors connected in a cascode configuration.

33. The circuit of claim 30, wherein the output transistor circuit includes a field effect transistor.

34. The circuit of claim 33, wherein the field effect transistor is a low-voltage field effect transistor, and wherein the output transistor circuit further comprises:
  a high-voltage field effect transistor coupled in series with the low-voltage field effect transistor to protect the low-voltage field effect transistor.

* * * * *

UNITED STATES PATENT AND TRADEMARK OFFICE
CERTIFICATE OF CORRECTION

PATENT NO. : 11,050,419 B2
APPLICATION NO. : 15/388726
DATED : June 29, 2021
INVENTOR(S) : McLachlan et al.

Page 1 of 1

It is certified that error appears in the above-identified patent and that said Letters Patent is hereby corrected as shown below:

In the Claims

In Column 11, Line 5, in Claim 20, after "high", delete "supply"

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*